(12) United States Patent
Irish et al.

(10) Patent No.: US 9,281,711 B2
(45) Date of Patent: Mar. 8, 2016

(54) CLASS E AMPLIFIER OVERLOAD DETECTION AND PREVENTION

(71) Applicant: QUALCOMM Incorporated, San Diego, CA (US)

(72) Inventors: Linda S. Irish, San Diego, CA (US); Stanley Slavko Toncich, San Diego, CA (US); William H. Von Novak, III, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 14/285,407

(22) Filed: May 22, 2014

(65) Prior Publication Data

US 2014/0252873 A1    Sep. 11, 2014

Related U.S. Application Data

(63) Continuation of application No. 13/436,650, filed on Mar. 30, 2012, now Pat. No. 8,736,368.

(60) Provisional application No. 61/524,259, filed on Aug. 16, 2011.

(51) Int. Cl.
  *H03F 3/217* (2006.01)
  *H02J 7/02* (2006.01)
  *H03F 1/52* (2006.01)
  *H01F 38/14* (2006.01)

(52) U.S. Cl.
  CPC ............... *H02J 7/025* (2013.01); *H01F 38/14* (2013.01); *H03F 1/523* (2013.01); *H03F 3/2176* (2013.01)

(58) Field of Classification Search
  CPC ..................................................... H03F 3/2176
  USPC ........................... 307/104; 320/108; 330/251
  See application file for complete search history.

(56) References Cited

U.S. PATENT DOCUMENTS

| | | | |
|---|---|---|---|
| 4,318,164 A | 3/1982 | Onodera et al. | |
| 5,179,511 A | 1/1993 | Troyk et al. | |
| 6,016,075 A | 1/2000 | Hamo | |
| 7,307,478 B2 | 12/2007 | Anand | |
| 7,378,826 B2 | 5/2008 | Liao | |
| 7,847,438 B2 | 12/2010 | Jin et al. | |

(Continued)

FOREIGN PATENT DOCUMENTS

| | | |
|---|---|---|
| CN | 101005268 A | 7/2007 |
| DE | 102006060769 A1 | 8/2007 |

(Continued)

OTHER PUBLICATIONS

International Search Report and Written Opinion—PCT/US2012/050614—ISA/EPO—Apr. 18, 2013.

(Continued)

*Primary Examiner* — Steven J Mottola
(74) *Attorney, Agent, or Firm* — Knobbe Martens Olson & Bear LLP

(57) ABSTRACT

Systems, methods and apparatus are disclosed for amplifiers for wireless power transfer. In one aspect a method is provided for controlling operation of an amplifier, such as a class E amplifier. The method may include monitoring an output of the amplifier. The method may further include adjusting a timing of an enabling switch of the amplifier based on the output of the amplifier.

18 Claims, 8 Drawing Sheets

(56) References Cited

U.S. PATENT DOCUMENTS

| | | | |
|---|---|---|---|
| 7,876,156 | B2 | 1/2011 | Tanaka et al. |
| 7,949,365 | B2 | 5/2011 | Sorrells et al. |
| 8,373,507 | B2 | 2/2013 | Acar et al. |
| 8,736,368 | B2 | 5/2014 | Irish et al. |
| 2004/0184627 | A1 | 9/2004 | Kost et al. |
| 2009/0086413 | A1 | 4/2009 | Takatani et al. |
| 2010/0085118 | A1 | 4/2010 | Chiu |
| 2011/0084656 | A1 | 4/2011 | Gao |
| 2012/0080957 | A1* | 4/2012 | Cooper et al. ............ 307/104 |

FOREIGN PATENT DOCUMENTS

| | | |
|---|---|---|
| JP | 2008028791 A | 2/2008 |
| WO | WO-2007100682 A1 | 9/2007 |
| WO | WO-2009037603 A2 | 3/2009 |
| WO | WO-2010076721 A1 | 7/2010 |

OTHER PUBLICATIONS

Liang et al., Steady-State Simulation and Optimization of Class-E Power Amplifiers With Extended Impedance Method, IEEE Transactions on Circuits and Systems I-Regular Papers, vol. 58, No. 6, Jun. 2001, pp. 1433-1445.

Partial International Search Report—PCT/US2012/050614—ISA/EPO—Jan. 30, 2013.

Tabrizi, M M., et al., "A New Topology for Power Control of High Efficiency Class-E Switched Mode Power Amplifier", System-On-Chip for Real-Time Applications, 2005, Proceedings, Fifth International Workshop on BANFF, AB, Canada Jul. 20-24, 2005, Piscataway, NJ, USA,IEEE, Jul. 20, 2005, pp. 92-95, XP010851920.

Yoo et al., A common-Gate Switched 0.9-W Class-E Power Amplifier with 41% PAE in 0.25-m CMOS, IEEE Journal of Solid-state Circuits, vol. 36, No. 5, May 2001, pp. 823-830.

* cited by examiner

CLASS E AMPLIFIER OVERLOAD DETECTION AND PREVENTION

CROSS REFERENCE TO RELATED APPLICATIONS

This application is a continuation of U.S. patent application Ser. No. 13/436,650, filed on Mar. 30, 2012, which has been issued on May 27, 2014 as U.S. Pat. No. 8,736,368, which claims priority under 35 U.S.C. §119(e) to U.S. Provisional Patent Application No. 61/524,259 entitled "CLASS E AMPLIFIER OVERLOAD DETECTION AND PREVENTION", filed on Aug. 16, 2011. Each of these applications is hereby expressly incorporated herein by reference in its entirety. Furthermore, any and all priority claims identified in the Application Data Sheet, or any correction thereto, are hereby incorporated by reference under 37 CFR. 1.57.

FIELD

The present invention relates generally to wireless power. More specifically, the disclosure is directed to class E amplifiers and their use for driving a wireless power transmit antenna.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power. As such, these devices constantly require recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a method of controlling operation of an amplifier. The method includes monitoring an output of an enabling switch of the amplifier. The method further includes adjusting a timing of the enabling switch based on the output. The method further includes enabling the switch when the output of the switch falls below a first threshold above a zero crossover point.

Another aspect of the disclosure provides a method of operating a switch in an amplifier. The method includes monitoring an output of the switch. The method further includes adjusting a bias voltage of the enabling switch based on the output of the switch.

Another aspect of the disclosure provides an apparatus for controlling operation of an amplifier. The apparatus includes means for monitoring an output of an enabling switch of the amplifier. The apparatus further includes means for adjusting a timing of the enabling switch based on the output. The apparatus further includes means for enabling the switch when the output of the switch falls below a first threshold above a zero crossover point.

Another aspect of the disclosure provides an apparatus for operating a switch in an amplifier. The apparatus further includes means for monitoring an output of the switch. The apparatus further includes means for adjusting a bias voltage of the enabling switch based on the output of the switch.

Another aspect of the disclosure provides a non-transitory computer-readable medium. The medium includes code that, when executed, causes an apparatus to monitor an output of an enabling switch of an amplifier. The medium further includes code that, when executed, causes the apparatus to adjust a timing of the enabling switch based on the output. The medium further includes code that, when executed, causes the apparatus to enable the switch when the output of the switch falls below a first threshold above a zero crossover point.

Another aspect of the disclosure provides a non-transitory computer-readable medium. The medium includes code that, when executed, causes an apparatus to monitor an output of a switch of an amplifier. The medium further includes code that, when executed, causes the apparatus adjust a bias voltage of the enabling switch based on the output of the switch.

Another aspect of the disclosure provides an apparatus configured to transmit wireless charging power. The apparatus includes an amplifier including an enabling switch electrically coupled to a load. The apparatus further includes a monitoring circuit configured to monitor an output of the enabling switch. The apparatus further includes a timing circuit configured to adjust a timing of the enabling switch based on the output. The apparatus further includes a driving circuit configured to enable the switch when the output of the switch falls below a first threshold above a zero crossover point.

Another aspect of the disclosure provides an apparatus configured to transmit wireless charging power. The apparatus includes an amplifier including an enabling switch electrically coupled to a load. The apparatus further includes a monitoring circuit configured to monitor an output of the enabling switch. The apparatus further includes a bias circuit configured to adjust a bias voltage of the enabling switch based on the output of the switch.

Figure 1:
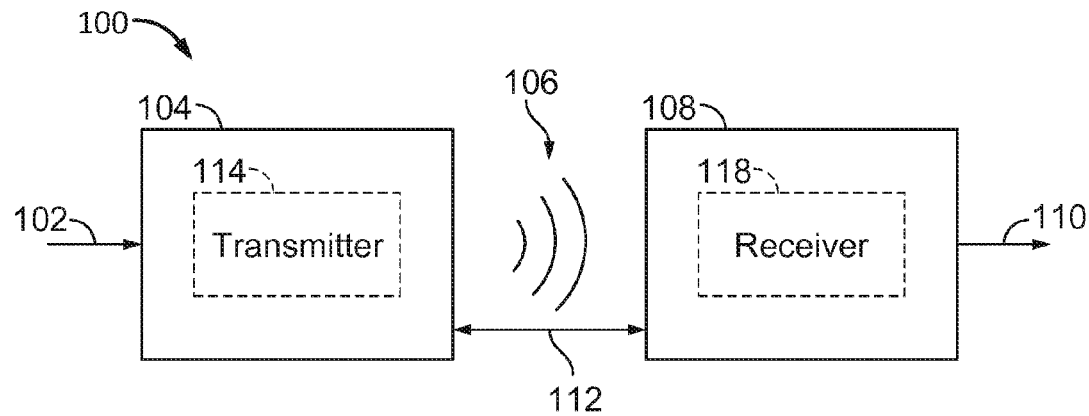
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. The exemplary embodiments of the invention may be practiced without these specific details. In some instances, well-known structures and devices are shown in block diagram form in order to avoid obscuring the novelty of the exemplary embodiments presented herein.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

FIG. 1 is a functional block diagram of an exemplary wireless power transfer system 100, in accordance with exemplary embodiments of the invention. Input power 102 may be provided to a transmitter 104 from a power source (not shown) for generating a field 105 for providing energy transfer. A receiver 108 may couple to the field 105 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or very close, transmission losses between the transmitter 104 and the receiver 108 are minimal. As such, wireless power transfer may be provided over larger distance in contrast to purely inductive solutions that may require large coils that require coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 105 produced by the transmitter 104. The field 105 corresponds to a region where energy output by the transmitter 104 may be captured by a receiver 105. In some cases, the field 105 may correspond to the "near-field" of the transmitter 104 as will be further described below. The transmitter 104 may include a transmit coil 114 for outputting an energy transmission. The receiver 108 further includes a receive coil 118 for receiving or capturing energy from the energy transmission. The near-field may correspond to a region in which there are strong reactive fields resulting from the currents and charges in the transmit coil 114 that minimally radiate power away from the transmit coil 114. In some cases the near-field may correspond to a region that is within about one wavelength (or a fraction thereof) of the transmit coil 114. The transmit and receive coils 114 and 118 are sized according to applications and devices to be associated therewith. As described above, efficient energy transfer may occur by coupling a large portion of the energy in a field 105 of the transmit coil 114 to a receive coil 118 rather than propagating most of the energy in an electromagnetic wave to the far field. When positioned within the field 105, a "coupling mode" may be developed between the transmit coil 114 and the receive coil 118. The area around the transmit and receive coils 114 and 118 where this coupling may occur is referred to herein as a coupling-mode region.

Figure 2:
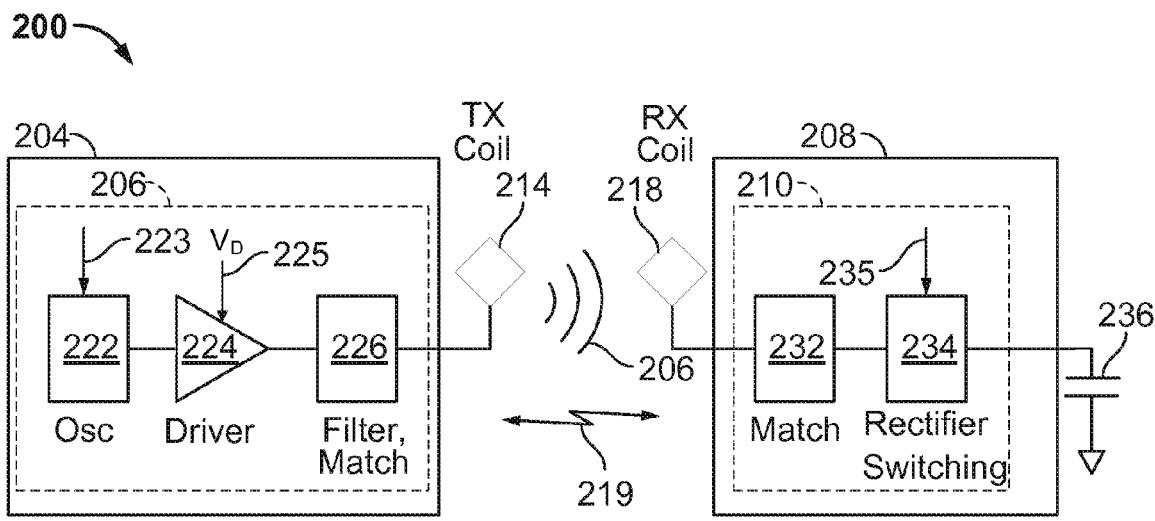
FIG. 2 is a functional block diagram of exemplary components that may be used in the wireless power transfer system of FIG. 1, in accordance with various exemplary embodiments of the invention.

FIG. 2 is a functional block diagram of exemplary components that may be used in the wireless power transfer system 100 of FIG. 1, in accordance with various exemplary embodiments of the invention. The transmitter 204 may include transmit circuitry 206 that may include an oscillator 222, a driver circuit 224, and a filter and matching circuit 226. The oscillator 222 may be configured to generate a signal at a desired frequency, such as 468.75 KHz, 6.78 MHz or 13.56 MHz, that may be adjusted in response to a frequency control signal 223. The oscillator signal may be provided to a driver circuit 224 configured to drive the transmit coil 214 at, for example, a resonant frequency of the transmit coil 214. The driver circuit 224 may be a switching amplifier configured to receive a square wave from the oscillator 222 and output a sine wave. For example, the driver circuit 224 may be a class E amplifier. A filter and matching circuit 226 may be also included to filter out harmonics or other unwanted frequencies and match the impedance of the transmitter 204 to the transmit coil 214.

The receiver 208 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive coil 218. The receiver 208 and transmitter 204 may additionally communicate on a separate communication channel 219 (e.g., Bluetooth, zigbee, cellular, etc). The receiver 208 and transmitter 204 may alternatively communicate via in-band signaling using characteristics of the wireless field 206.

As described more fully below, receiver 208, that may initially have a selectively disableable associated load (e.g., battery 236), may be configured to determine whether an amount of power transmitted by transmitter 204 and receiver by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID may be configured to receive power from a wireless power transfer field and communicate by interacting with the wireless power transfer field and/or utilize the received power to communicate with a transmitter 204 or other devices.

Figure 3:
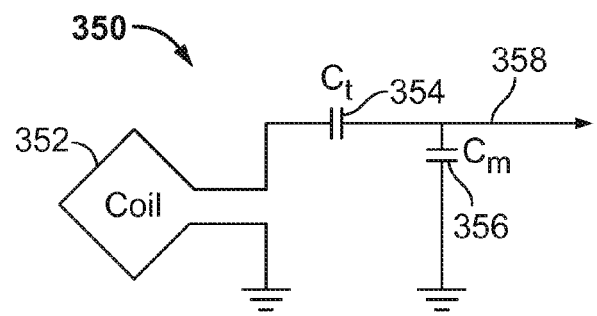
FIG. 3 is a schematic diagram of a portion of transmit circuitry or receive circuitry of FIG. 2 including a transmit or receive coil, in accordance with exemplary embodiments of the invention.

FIG. 3 is a schematic diagram of a portion of transmit circuitry 206 or receive circuitry 210 of FIG. 2 including a transmit or receive coil 352, in accordance with exemplary embodiments of the invention. As illustrated in FIG. 3, transmit or receive circuitry 350 used in exemplary embodiments may include a coil 352. The coil may also be referred to or be configured as a "loop" antenna 352. The coil 352 may also be referred to herein or be configured as a "magnetic" antenna or an induction coil. The term "coil" is intended to refer to a component that may wirelessly output or receive energy for coupling to another "coil." The coil may also be referred to as an "antenna" of a type that is configured to wirelessly output or receive power. The coil 352 may be configured to include an air core or a physical core such as a ferrite core (not shown). Air core loop coils may be more tolerable to extraneous physical devices placed in the vicinity of the core. Furthermore, an air core loop coil 352 allows the placement of other components within the core area. In addition, an air core loop may more readily enable placement of the receive coil 218 (FIG. 2) within a plane of the transmit coil 214 (FIG. 2) where the coupled-mode region of the transmit coil 214 (FIG. 2) may be more powerful.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 105 of the transmitting coil to the receiving coil residing in the neighborhood where this field 105 is established rather than propagating the energy from the transmitting coil into free space.

The resonant frequency of the loop or magnetic coils is based on the inductance and capacitance. Inductance may be simply the inductance created by the coil 352, whereas, capacitance may be added to the coil's inductance to create a resonant structure at a desired resonant frequency. As a non-limiting example, capacitor 352 and capacitor 354 may be added to the transmit or receive circuitry 350 to create a resonant circuit that selects a signal 356 at a resonant frequency. Accordingly, for larger diameter coils, the size of capacitance needed to sustain resonance may decrease as the diameter or inductance of the loop increases. Furthermore, as the diameter of the coil increases, the efficient energy transfer area of the near-field may increase. Other resonant circuits formed using other components are also possible. As another non-limiting example, a capacitor may be placed in parallel between the two terminals of the coil 350. For transmit coils, a signal 358 with a frequency that substantially corresponds to the resonant frequency of the coil 352 may be an input to the coil 352.

In one embodiment, the transmitter 104 may be configured to output a time varying magnetic field with a frequency corresponding to the resonant frequency of the transmit coil 114. When the receiver is within the field 105, the time varying magnetic field may induce a current in the receive coil 118. As described above, if the receive coil 118 is configured to be resonant at the frequency of the transmit coil 118, energy may be efficiently transferred. The AC signal induced in the receive coil 118 may be rectified as described above to produce a DC signal that may be provided to charge or to power a load.

Figure 4:
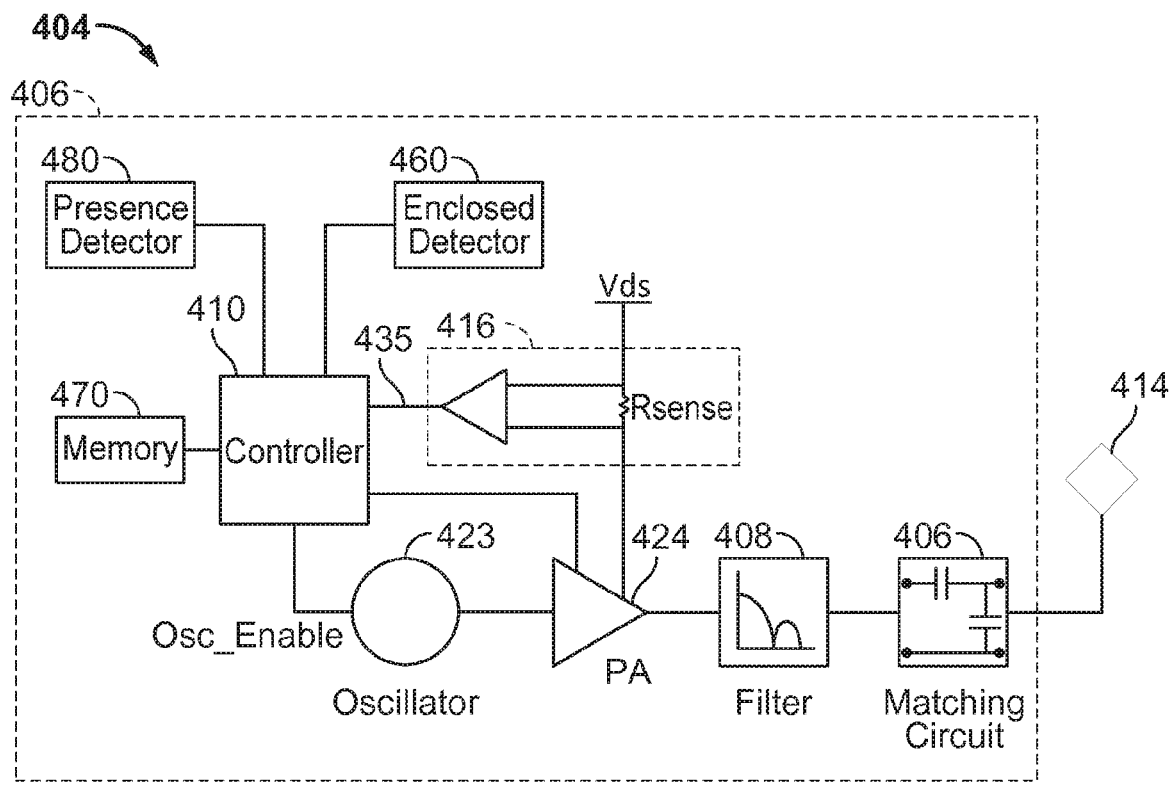
FIG. 4 is a functional block diagram of a transmitter that may be used in the wireless power transfer system of FIG. 1, in accordance with exemplary embodiments of the invention.

FIG. 4 is a functional block diagram of a transmitter 404 that may be used in the wireless power transfer system of FIG. 1, in accordance with exemplary embodiments of the invention. The transmitter 404 may include transmit circuitry 406 and a transmit coil 414. The transmit coil 414 may be the coil 352 as shown in FIG. 3. Transmit circuitry 406 may provide RF power to the transmit coil 414 by providing an oscillating signal resulting in generation of energy (e.g., magnetic flux) about the transmit coil 414. Transmitter 404 may operate at any suitable frequency. By way of example, transmitter 404 may operate at the 13.56 MHz ISM band.

Transmit circuitry 406 may include a fixed impedance matching circuit 409 for matching the impedance of the transmit circuitry 406 (e.g., 50 ohms) to the transmit coil 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the coil 414 or DC current drawn by the driver circuit 424. Transmit circuitry 406 further includes a driver circuit 424 configured to drive an RF signal as determined by an oscillator 423. The transmit circuitry 406 may be comprised of discrete devices or circuits, or alternately, may be comprised of an integrated assembly. An exemplary RF power output from transmit coil 414 may be on the order of 2.5 Watts.

Transmit circuitry 406 may further include a controller 415 for selectively enabling the oscillator 423 during transmit phases (or duty cycles) for specific receivers, for adjusting the frequency or phase of the oscillator 423, and for adjusting the output power level for implementing a communication protocol for interacting with neighboring devices through their attached receivers. It is noted that the controller 415 may also be referred to herein as processor 415. Adjustment of oscillator phase and related circuitry in the transmission path may allow for reduction of out of band emissions, especially when transitioning from one frequency to another.

The transmit circuitry 406 may further include a load sensing circuit 416 for detecting the presence or absence of active receivers in the vicinity of the near-field generated by transmit coil 414. By way of example, a load sensing circuit 416 monitors the current flowing to the driver circuit 424, that may be affected by the presence or absence of active receivers in the vicinity of the field generated by transmit coil 414 as will be further described below. Detection of changes to the loading on the driver circuit 424 are monitored by controller 415 for use in determining whether to enable the oscillator 423 for transmitting energy and to communicate with an active receiver. As described more fully below, a current measured at the driver circuit 424 may be used to determine whether an invalid device is positioned within a wireless power transfer region of the transmitter 404.

The transmit coil 414 may be implemented with a Litz wire or as an antenna strip with the thickness, width and metal type selected to keep resistive losses low. In a one implementation, the transmit coil 414 may generally be configured for association with a larger structure such as a table, mat, lamp or other less portable configuration. Accordingly, the transmit coil 414 generally may not need "turns" in order to be of a practical dimension. An exemplary implementation of a transmit coil 414 may be "electrically small" (i.e., fraction of the wavelength) and tuned to resonate at lower usable frequencies by using capacitors to define the resonant frequency.

The transmitter 404 may gather and track information about the whereabouts and status of receiver devices that may be associated with the transmitter 404. Thus, the transmit circuitry 406 may include a presence detector 480, an enclosed detector 460, or a combination thereof, connected to the controller 415 (also referred to as a processor herein). The controller 415 may adjust an amount of power delivered by the driver circuit 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter 404. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit coil 414 may transmit at a specific frequency. In some cases, these regulations are meant to protect humans from electromagnetic radiation. However, there may be environments where a transmit coil 414 is placed in areas not occupied by humans, or occupied infrequently by humans, such as, for example, garages, factory floors, shops, and the like. If these environments are free from humans, it may be permissible to increase the power output of the transmit coil 414 above the normal power restrictions regulations. In other words, the controller 415 may adjust the power output of the transmit coil 414 to a regulatory level or lower in response to human presence and adjust the power output of the transmit coil 414 to a level above the regulatory level when a human is outside a regulatory distance from the electromagnetic field of the transmit coil 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive coil that a device is fully charged. To prevent the transmitter 404 from automatically shutting down if another device is placed in its perimeter, the transmitter 404 automatic shut off feature may be activated only after a set phase of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
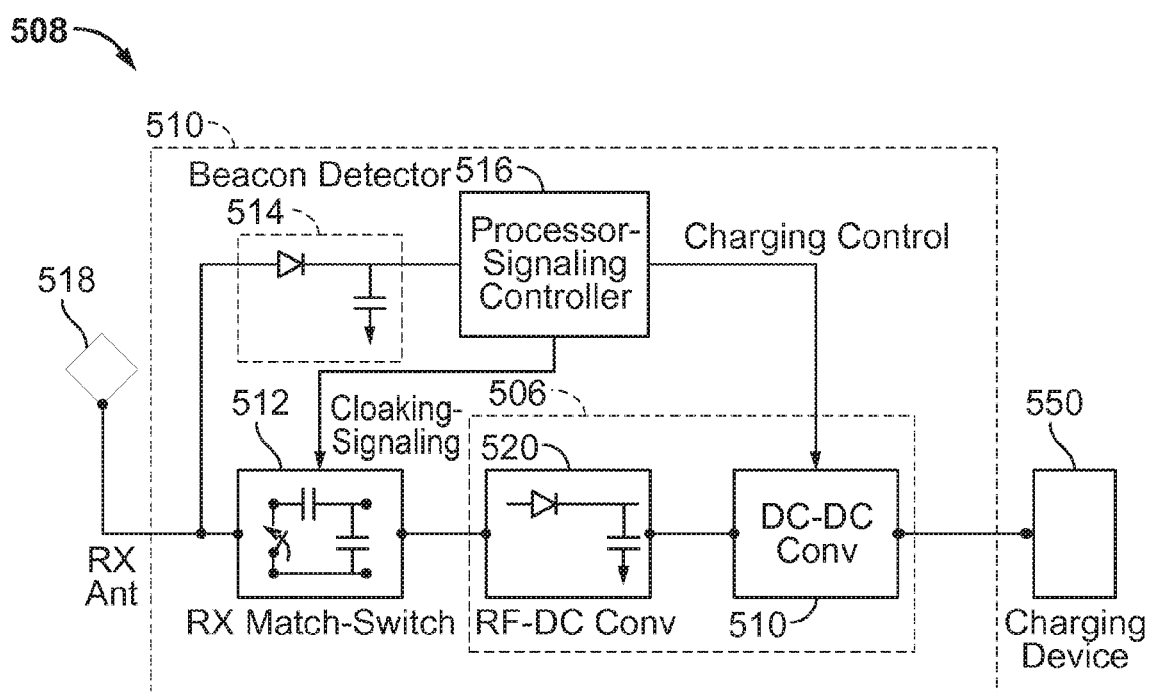
FIG. 5 is a functional block diagram of a receiver that may be used in the wireless power transfer system of FIG. 1, in accordance with exemplary embodiments of the invention.

FIG. 5 is a functional block diagram of a receiver 508 that may be used in the wireless power transfer system of FIG. 1, in accordance with exemplary embodiments of the invention. The receiver 508 includes receive circuitry 510 that may include a receive coil 518. Receiver 508 further couples to device 550 for providing received power thereto. It should be noted that receiver 508 is illustrated as being external to device 550 but may be integrated into device 550. Energy may be propagated wirelessly to receive coil 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (an other medical devices), and the like.

Receive coil 518 may be tuned to resonate at the same frequency, or within a specified range of frequencies, as transmit coil 414 (FIG. 4). Receive coil 518 may be similarly dimensioned with transmit coil 414 or may be differently sized based upon the dimensions of the associated device 550. By way of example, device 550 may be a portable electronic device having diametric or length dimension smaller that the diameter of length of transmit coil 414. In such an example, receive coil 518 may be implemented as a multi-turn coil in order to reduce the capacitance value of a tuning capacitor (not shown) and increase the receive coil's impedance. By way of example, receive coil 518 may be placed around the substantial circumference of device 550 in order to maximize the coil diameter and reduce the number of loop turns (i.e., windings) of the receive coil 518 and the inter-winding capacitance.

Receive circuitry 510 may provide an impedance match to the receive coil 518. Receive circuitry 510 includes power conversion circuitry 506 for converting a received RF energy source into charging power for use by the device 550. Power conversion circuitry 506 includes an RF-to-DC converter 520 and may also in include a DC-to-DC converter 522. RF-to-DC converter 520 rectifies the RF energy signal received at receive coil 518 into a non-alternating power with an output voltage represented by $V_{rect}$. The DC-to-DC converter 522 (or other power regulator) converts the rectified RF energy signal into an energy potential (e.g., voltage) that is compatible with device 550 with an output voltage and output current represented by $V_{out}$ and $I_{out}$. Various RF-to-DC converters are contemplated, including partial and full rectifiers, regulators, bridges, doublers, as well as linear and switching converters.

Receive circuitry 510 may further include switching circuitry 512 for connecting receive coil 518 to the power conversion circuitry 506 or alternatively for disconnecting the power conversion circuitry 506. Disconnecting receive coil 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter driver circuit 424. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 μsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive coil 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations, that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 522 for improved performance.

Figure 6:
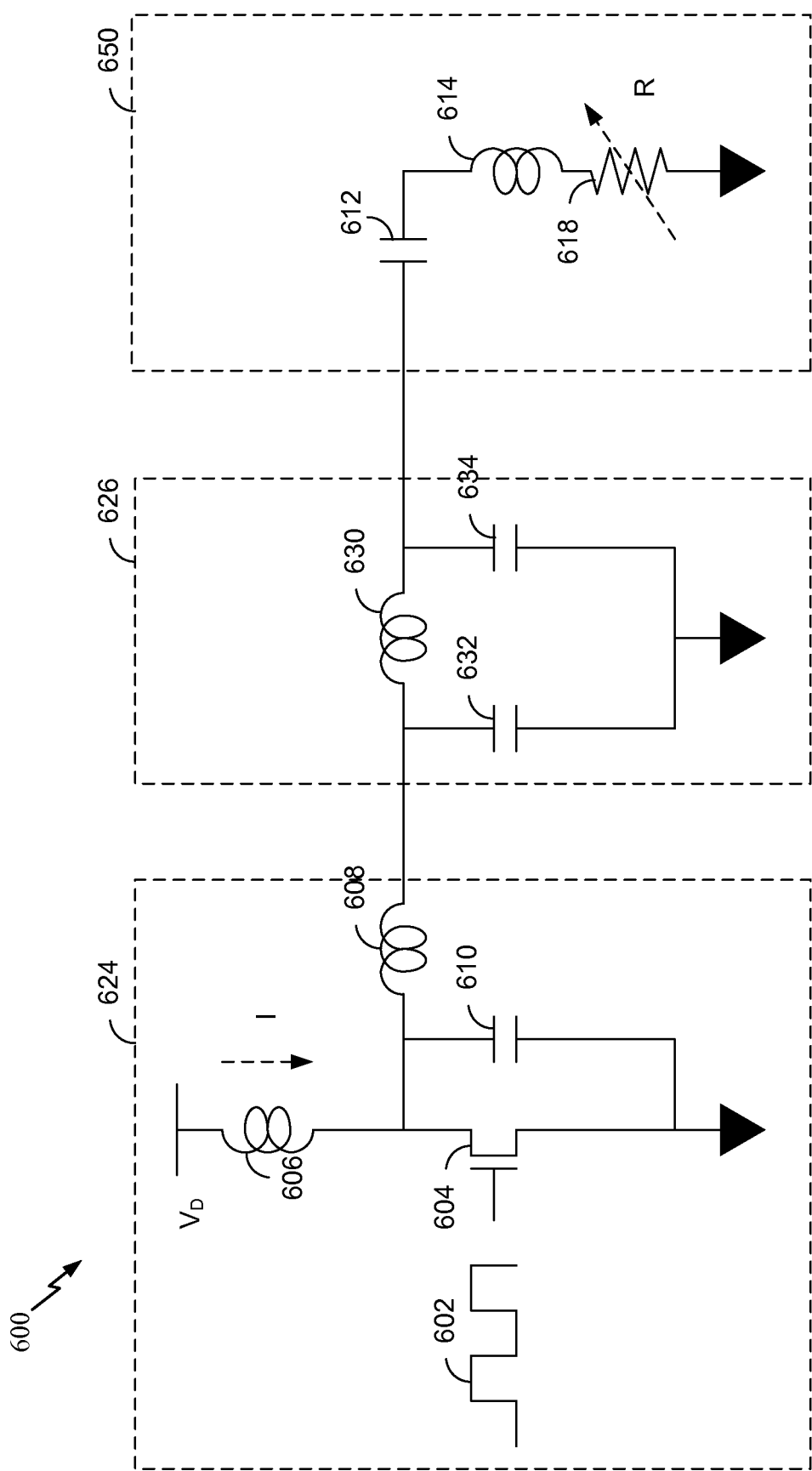
FIG. 6 is a schematic diagram of a portion of transmit circuitry that may be used in the transmit circuitry of FIG. 4.

FIG. 6 is a schematic diagram of a portion of transmit circuitry 600 that may be used in the transmit circuitry 406 of FIG. 4. The transmit circuitry 600 may include a driver circuit 624 as described above in FIG. 4. As described above, the driver circuit 624 may be a switching amplifier that may be configured to receive a square wave and output a sine wave to be provided to the transmit circuit 650. In some cases the driver circuit 624 may be referred to as an amplifier circuit. The driver circuit 624 is shown as a class E amplifier. However, any suitable driver circuit 624 may be used in accordance with embodiments of the invention. The driver circuit 624 may be driven by an input signal 602 from an oscillator 423 as shown in FIG. 4. The driver circuit 624 may also be provided with a drive voltage $V_D$ that is configured to control the maximum power that may be delivered through a transmit circuit 650. To eliminate or reduce harmonics, the transmit circuitry 600 may include a filter circuit 626. The filter circuit 626 may be a three pole (capacitor 634, inductor 632, and capacitor 636) low pass filter circuit 626.

The signal output by the filter circuit 626 may be provided to a transmit circuit 650 comprising a coil 614. The transmit circuit 650 may include a series resonant circuit having a capacitance 620 and inductance (e.g., that may be due to the inductance or capacitance of the coil or to an additional capacitor component) that may resonate at a frequency of the filtered signal provided by the driver circuit 624. The load of the transmit circuit 650 may be represented by the variable resistor 622. The load may be a function of a wireless power receiver 508 that is positioned to receive power from the transmit circuit 650.

The load presented the driver circuit 624 may have a reactance that varies due to, for example, a variable number of wireless power receivers that are positioned to receive power. The reactance of the load may vary widely for a loosely coupled wireless power transfer system 100. The efficiency of a driver circuit 624 may be sensitive to and vary due to changes in the load reactance. For example, Class E amplifiers may be sensitive to the loads placed on them, and may be damaged if the load changes excessively in either real or imaginary impedance. The switching devices may be damaged by overvoltage, over-current, or over-temperature operation.

Over-temperature operation can be caused by several issues, including a change in load. A class E amplifier may be highly efficient at one set of complex impedances. At this set of impedances, the class E amplifier exhibits zero-voltage switching behavior with a simple 50% gate drive duty cycle. The class E may turn on at zero voltage and the voltage returns to zero at the moment it shuts off. This may allow for a efficient switching operation.

Figure 7:
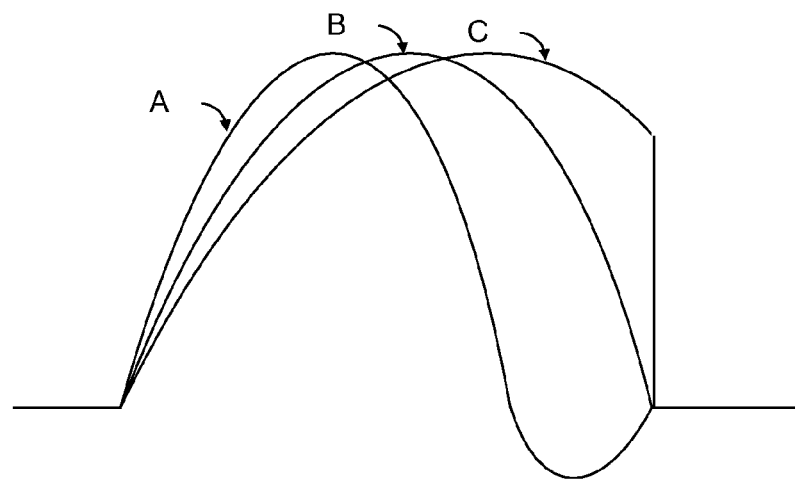
FIG. 7 shows a plot of voltage values across a device under various load characteristics.

FIG. 7 shows a plot of voltage values across a device with different load characteristics. In FIG. 7, curve B represents the voltage across the device at ideal loads (i.e., optimal switching), curve A represents an excessively capacitive load, and curve C represents an excessively inductive load. Outside this range of ideal impedances, zero voltage switching may not occur. When the load is excessively capacitive, for example, the ideal gate turn on point may occur sooner than the 50% point, and thus the device may be driven backwards into reverse conduction if a fixed gate drive is used. This results in inefficiencies since the switching devices are typically more lossy in the reverse direction. When the load is excessively inductive, the ideal gate turn on point may come after the 50% point, and thus the device may be forced to switch at a non-zero voltage. This increases switching losses.

In an embodiment, the efficiency of a class E power amplifier (PA), such as the driver circuit 624 (FIG. 6), depends primarily on the shape of the PA field effect transistor (FET) 604 drain voltage, for example, as shown in FIG. 7. When the pulse width of the drain voltage matches the duty cycle of the driver circuit 625, the PA is operating at maximum efficiency (curve B). In an embodiment, the pulse starts when the FET 604 turns off, so changing the pulse width changes the timing of the falling edge of the pulse. When the pulse is thin, efficiency drops slowly (curve A). When the pulse it is too wide it gets truncated by the FET 604 turning on, causing losses and possible damage of the FET 604 (curve C).

When taken to extremes, these additional losses can cause excessive heating and device failure. According to one embodiment, to avoid excessive heating and device failure, and to allow the class E amplifier to operate under non-ideal loads with higher efficiency, an adaptive gate drive can be used to change the gate drive waveform to better match the actual waveform at the switch. In an embodiment, a logic circuit divides the gate drive waveform into four phases, as shown in FIG. 8.

Figure 8:
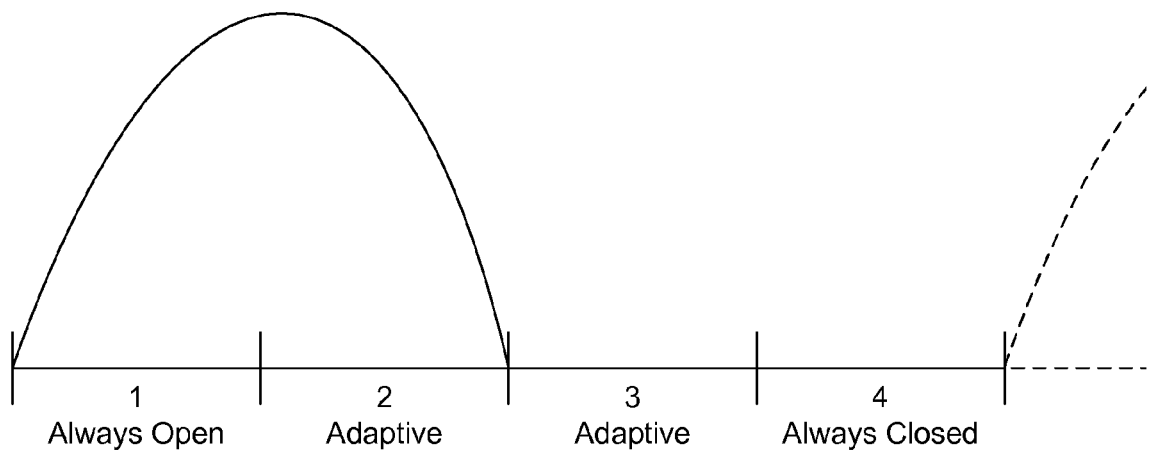
FIG. 8 shows an exemplary wave form of a Class E amplifier.

FIG. 8 shows an exemplary wave form of a Class E amplifier. Although FIG. 8 is described herein with respect to the wireless charging circuit 900 (FIG. 9), a person having ordinary skill in the art will appreciate that any circuit can be used to divide the gate waveform into the four phases.

Referring to FIG. 8, during a first phase, the switch T1 (FIG. 9) is always open. During this phase it is expected that the output voltage will rise due to normal class E operation. During second and third phases the switch may remain open, but the circuit now adaptively senses the voltage across the switch. If the switch voltage declines below a setpoint or threshold, it is likely that the voltage is about to cross zero. In an embodiment, the threshold is set near or just above 0 V. For example, the threshold can by set to a value sufficient to cause the switch to close just before the voltage across the switch becomes negative.

Accordingly, the circuit 900 (FIG. 9) can adapt the gate drive to the voltages across the switch T1, which in turn are dependent on the output load. As such, during phases two and three, the switch T1 can be turned on when voltage decreases to very close to zero. In an embodiment, the voltage detector can be set to a voltage above zero to provide "early" detection. Early detection may cancel out any circuit propagation delay such that the device can be driven on practically at 0 V. During the fourth phase, the switch T1 is always closed. By having a guaranteed on and off time for the switch, independent of load, startup is likely.

If the circuit 900 is not triggered during the second or third phases, then the voltage across the switch T1 never became near zero crossing. This overvoltage condition can also be detected and can be used to shut down the amplifier during conditions of bad loading, thus protecting the amplifier from damage. In some cases, this warning may be ignored during startup until the amplifier is in stable operation.

Figure 9:
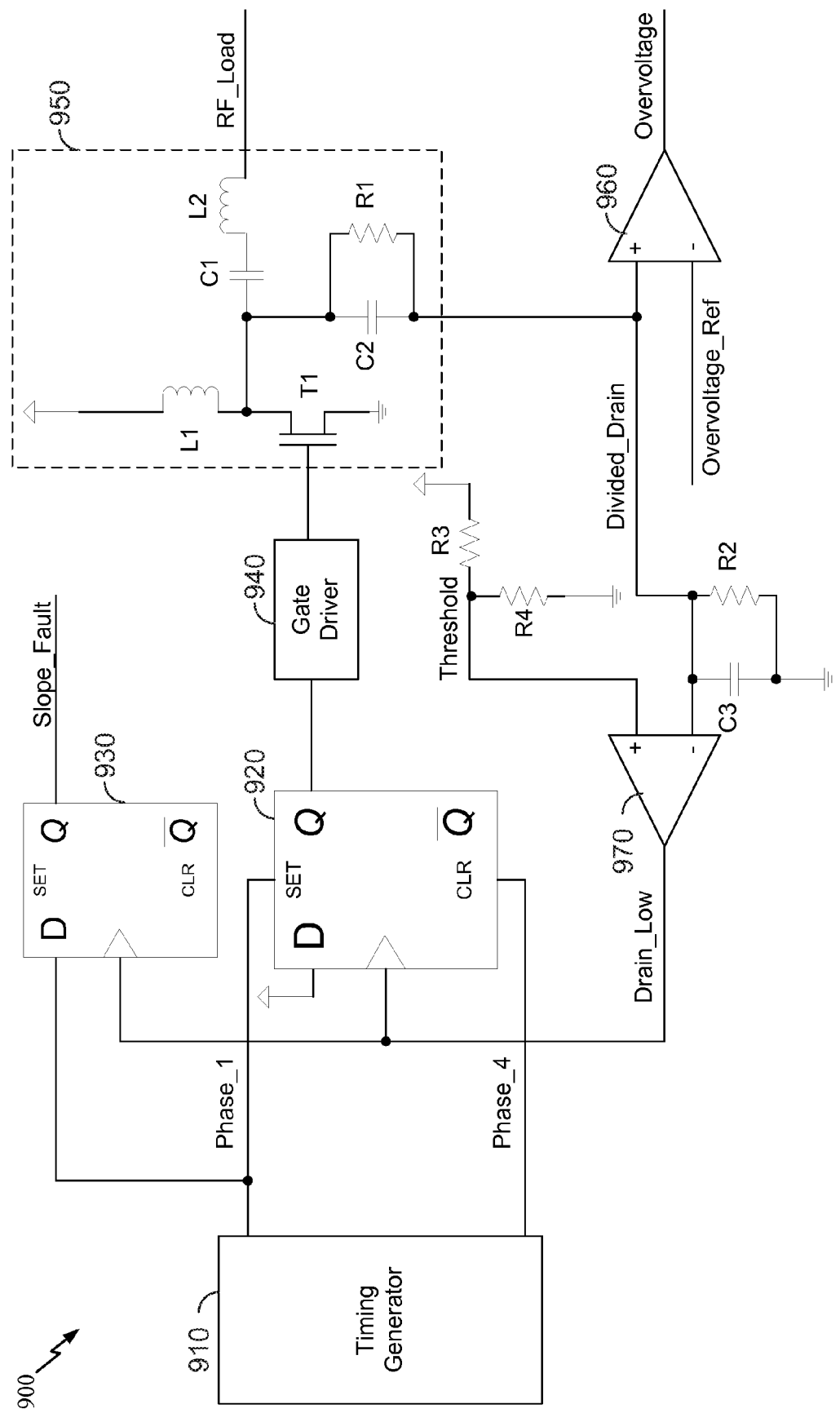
FIG. 9 shows an exemplary schematic diagram of a wireless charging system according to an embodiment.

FIG. 9 is an exemplary schematic diagram of a wireless charging circuit 900 according to an embodiment. As shown, the circuit 900 includes a timing generator 910, a first flip-flop 920, a second flip-flop 930, a gate driver 940, a class-E amplifier 950 including a switch or gate T1, a first op-amp 960, a second resistor R2, a third capacitor C3, a third resistor R3, a fourth resistor R2, and a second op-amp 970. Although various components are described herein with respect to the circuit 900, a person having ordinary skill in the art will appreciate that one or more components may be added, removed, or reconfigured within the scope of this disclosure. For example, input and output phases of various components can be adjusted to facilitate active-low and active-high operation.

Referring to FIG. 9, the timing generator 910 serves to generate the four phases. As shown, the timing generator 910 is configured to generate two signals: Phase_1 and Phase_4. The signal Phase_1 serves to indicate that the first phase is active, as described above with respect to FIG. 8. The signal Phase_4 serves to indicate that the second phase is active. In an embodiment, there may be no signal explicitly indicating that the second or third phases are active. For example, the circuit 900 can default to the adaptive second and third phases when neither the signal Phase_1 nor the signal Phase_4 is active. In an embodiment, the timing generator 910 can include a gray-code counter configured to generate the four phases.

The first flip-flop 920 can serve to drive the switch T1 open during the first phase, to drive the switch T1 closed during the fourth phase, and to adaptively close the switch T1 during the second and third phases. The first flip-flop 920 is a D flip-flop including a SET input electrically coupled to the signal Phase_1 from the timing generator 910, a CLR input electrically coupled to the signal Phase_4 from the timing generator 910, a D input electrically coupled to a voltage source (representing a logic "1"), a clock input electrically coupled to a signal Drain_Low from the second op-amp 970, and a Q output electrically coupled to the gate driver 940.

The signal Drain_Low serves to indicate that the voltage across the switch T1 is at or below the threshold voltage, as will be described in greater detail herein. When the circuit 900 is in the second or third phase, and the signals Phase_1 and Phase_2 are inactive, the output of the first flip-flop 920 is dependent on the signal Drain_Low. Specifically, when the signal Drain_Low becomes active, the first flip-flop 920 will drive the output Q to close the switch T1.

The second flip-flop 930 serves to detect a slope-fault error condition. In the first phase, the switch T1 should always be open. Accordingly, if the voltage across the switch T1 crosses the near-zero threshold voltage while the signal Phase_1 is active, there may be something wrong with the operation of the circuit 900. The second flip-flop 930 includes a D input electrically coupled to the signal Phase_1 from the timing generator 910, a clock input electrically coupled to the signal Drain_Low from the second op-amp 970, and an output Q that drives a signal Slope_Fault. If the signal Drain_Low becomes active while the signal Phase_1 is active, the second flip-flop 930 will indicate an error condition by driving the signal Slope_Fault active. In various embodiments, one or more error handling circuits can shut down the circuit 900 during a Slope_Fault.

The gate driver 940 serves to drive the switch T2 based on the output Q from the first flip-flop 920. The gate driver 930 can be implemented in any suitable fashion to appropriately drive the switch T2.

The class-E amplifier 950 serves to drive an RF_Load. In an embodiment, the class-E amplifier 950 provides wireless charging power to a receiver. The class-E amplifier 950 can be a power amplifier such as, for example, the driver circuit 624 (FIG. 6). As shown, the class-E amplifier 950 includes the switch or gate T1, a first inductor L1, a first capacitor C1, a second inductor L2, a second capacitor C2, and a first resistor R1. The output of the switch T1 is electrically coupled, through the second capacitor C2 and the first resistor R1, to the first op-amp 960 and the second op-amp 970. The first resistor R1 and the second resistor R1 can form a voltage divider, creating a signal Divided_Drain representing the voltage divided output of the switch T1.

The first op-amp 960 serves to detect an overvoltage condition at the output of the switch T1. The first op-amp 960 includes a non-inverting input electrically coupled to the voltage divided output of the switch T1 (Divided_Drain), an inverting input electrically coupled to an overvoltage reference voltage Overvoltage_Ref, and an output driving a signal Overvoltage. The Overvoltage_Ref can be any reference voltage over which the switch T1 should not be driven, accounting for the divided voltage of the signal Divided_Drain. When the signal Divided_Drain is greater than the Overvoltage_Ref, the first op-amp 960 drives the signal Overvoltage active. In various embodiments, one or more error handling circuits can shut down the circuit 900 during an overvoltage condition. In an embodiment, an overvoltage condition can be caused by an improper RF_Load.

The second op-amp 970 serves to detect when the output of the switch T1 is about to cross the zero-line. Specifically, the second op-amp 970 is configured to drive the signal Drain_Low active when the voltage across the switch T1 drops below the near-zero threshold voltage. The second op-amp 970 includes a non-inverting input electrically coupled to a Threshold reference voltage, an inverting input electrically coupled to the voltage divided output of the switch T1 (Divided_Drain), and an output driving the signal Drain_Low. The Threshold reference voltage can be set, for example, using a voltage divider including the third resistor R3 and the fourth resistor R4.

Figure 10:
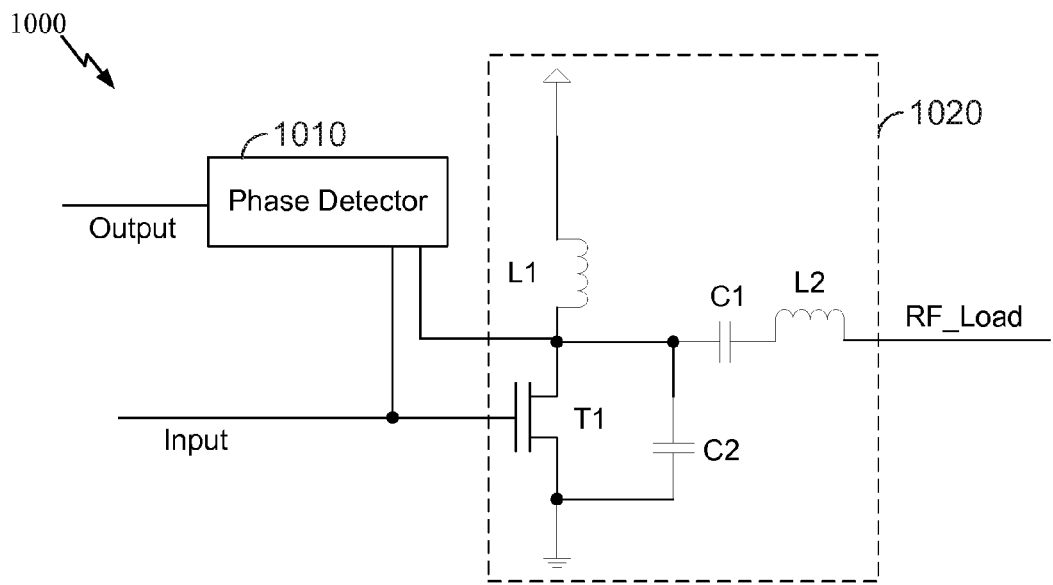
FIG. 10 shows an exemplary schematic diagram of a wireless charging system according to another embodiment.

FIG. 10 is an exemplary schematic diagram of a wireless charging circuit 1000 according to another embodiment. According to the embodiment shown in FIG. 10, a phase detector can watch at the rising edge of the gate and the falling of the drain. A phase locked loop or delay locked loop can align the gate such that the gate rises just after the drain falls. As shown, the circuit 1000 includes a phase detector 1010, and a class-E amplifier 1020 including a switch or gate T1. Although various components are described herein with respect to the circuit 1000, a person having ordinary skill in the art will appreciate that one or more components may be added, removed, or reconfigured within the scope of this disclosure. For example, input and output phases of various components can be adjusted to facilitate active-low and active-high operation.

The phase detector 1010 serves to detect the phase difference between the input gate drive signal and the output waveform of the gate T1. The phase detector 1010 includes an timing input, an input electrically coupled to the output of the switch T1, and an phase detection output. The phase detector 1010 can be configured to sample the input gate drive signal, to sample the output waveform at the drain of the switch T1, and compare the two. The phase detector 1010 can output the phase difference for adjustment of the timing of the signal at the gate of the switch T1 such that the gate rises just after the drain falls. In various embodiments, the phase detector 1010 can form a portion of a phase locked look (PLL) and/or a delay locked loop (DLL). In an embodiment, the delay between the falling voltage at the drain and the rising voltage at the gate of the switch T1 can be adjusted. One or more inputs to the phase detector 1010 can be voltage divided.

The class-E amplifier 1020 serves to drive an RF_Load. In an embodiment, the class-E amplifier 1020 provides wireless charging power to a receiver. The class-E amplifier 1020 can be a power amplifier such as, for example, the driver circuit 624 (FIG. 6). As shown, the class-E amplifier 950 includes the switch or gate T1, a first inductor L1, a first capacitor C1, a second inductor L2, and a second capacitor C2.

Figure 11:
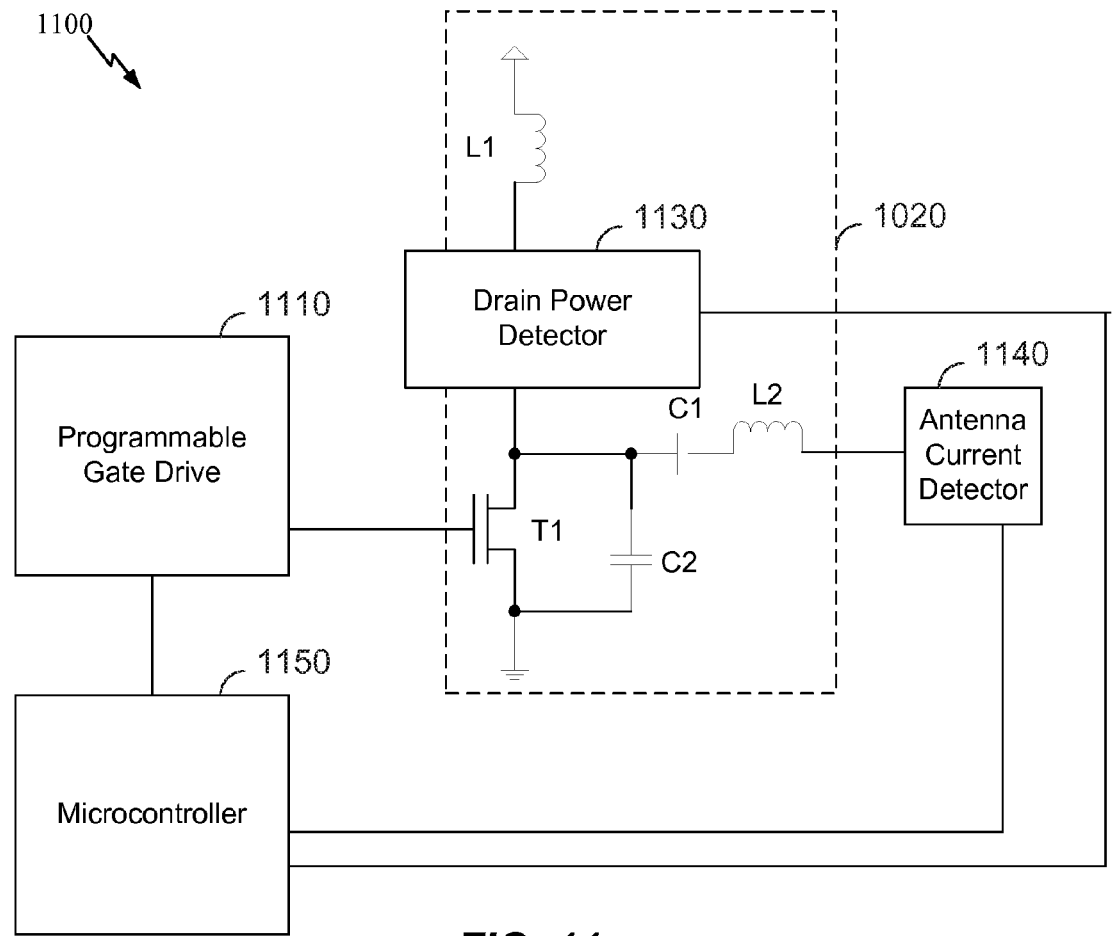
FIG. 11 shows an exemplary schematic diagram of a wireless charging system according to yet another embodiment.

FIG. 11 is an exemplary schematic diagram of a wireless charging circuit 1100 according to yet another embodiment. According to the embodiment shown in FIG. 11, a programmable gate driver, under software control, can increase or decrease the gate turn on delay and search for the sweet spot by looking at antenna current divided by DC power. When a chosen duty cycle results in the highest ratio (antenna current/ DC power) then gate drive timing has been optimized.

As shown in FIG. 11 the circuit 1100 includes a programmable gate drive 1110, a class-E amplifier 1120 including a switch or gate T1, a drain power detector 1130, an antenna current detector 1140, and a microcontroller 1150. Although various components are described herein with respect to the circuit 1100, a person having ordinary skill in the art will appreciate that one or more components may be added, removed, or reconfigured within the scope of this disclosure. For example, input and output phases of various components can be adjusted to facilitate active-low and active-high operation.

The programmable gate drive 1110 serves to drive the gate of the switch T1 in accordance with a programmable timing received from the microcontroller 1120. The programmable gate drive 1110 includes a programmable input electrically coupled to a drive signal from the microcontroller 1150 and an output electrically coupled to the gate of the switch T1 in the class-E amplifier 1120.

The class-E amplifier 1120 serves to drive an RF_Load, for example through an antenna. In an embodiment, the class-E amplifier 1020 provides wireless charging power to a receiver. The class-E amplifier 1020 can be a power amplifier such as, for example, the driver circuit 624 (FIG. 6). As shown, the class-E amplifier 950 includes the switch or gate T1, a first inductor L1, a first capacitor C1, a second inductor L2, and a second capacitor C2.

The drain power detector 1130 serves to detect the DC power draw at the switch T1. The drain power detector 1130 provides an output to the microcontroller 1150 indicative of the power draw of the switch T1. The antenna current detector 1140 serves to detect current at the antenna (not shown). The antenna current detector 1140 provides an output to the microcontroller 1150 indicative of the current at the antenna.

The microcontroller 1150 serves to control the timing of the switch T1 based on a measured efficiency of the output of the class-E amplifier 1120. In an embodiment, the microcontroller 1150 measures efficiency based on a current the antenna and the power draw of the switch T1, although the microcontroller 1120 can measure efficiency based on any detectable values. The microcontroller includes an input electrically coupled to the drain power detector 1130, and input electrically coupled to the antenna current detector 1140, and an output electrically coupled to the programmable gate drive 1110. In an embodiment, the microcontroller 1150 can adjust the timing of the programmable gate drive 1110, seeking a maxima in efficiency. In an embodiment, the microcontroller 1150 may measure efficiency as antenna current divided by DC power of the switch T1. The microcontroller 1150 may seek an efficiency maxima by adjusting the programmable gate drive 1110 using, for example, a hill-climbing algorithm or other mathematical optimization algorithm known in the art.

Figure 12:
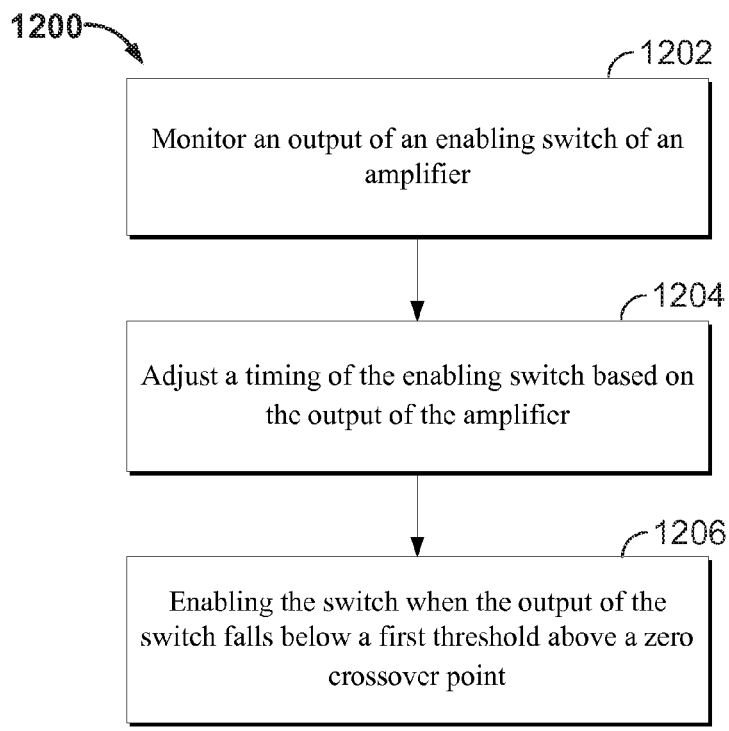
FIG. 12 shows a flow chart of an exemplary method of controlling operation of an amplifier.

FIG. 12 shows a flow chart 1200 of an exemplary method of controlling operation of an amplifier. The method can be implemented on one or more of the devices described above with respect to FIGS. 1-11. Although the method is described below with respect to elements of the circuit 900 (FIG. 9), those having ordinary skill in the art will appreciate that other components may be used to implement one or more of the steps described herein. Although blocks may be described as occurring in a certain order, the blocks can be reordered, blocks can be omitted, and/or additional blocks can be added.

First, at block 1202, the circuit 900 monitors an output of the switch T1 of the class-E amplifier 950. In another embodiment, the phase detection loop 1010 (FIG. 10) can monitor the output of the switch T1. In yet another embodiment, the microcontroller 1150 (FIG. 11) can monitor the output of the switch T1.

Next, at block 1203, the circuit 900 adjusts a timing of the enabling switch T1 based on the output of the amplifier 950. For example, during the adaptive second and third phases, the first flip-flop 920 can close the switch T1 when the output of the switch crosses the near-zero threshold value. Thus, at block 1206, the circuit 900 enables the switch T1 when the output of the switch falls below a first threshold above a zero crossover point. In another embodiment, the phase detection loop 1010 can adjust the timing of the switch T1 based on the output of the switch. In yet another embodiment, the microcontroller 1150 can adjust the timing of the programmable gate drive 1110, seeking a maxima in efficiency.

Figure 13:
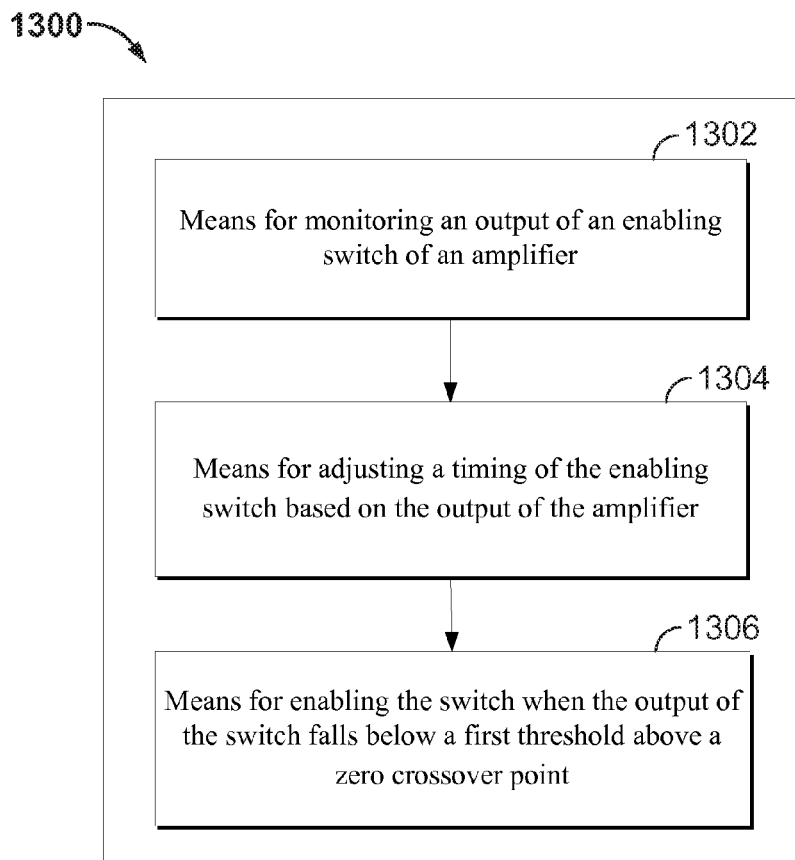
FIG. 13 is a functional block diagram of an exemplary wireless device that may be employed within the wireless power transfer system of FIG. 1.

FIG. 13 is a functional block diagram 1300 of an exemplary wireless device that may be employed within the wireless power transfer system of FIG. 1. The device 1300 comprises means 1302 for monitoring an output of an enabling switch T1 of the amplifier 950, means 1304 for adjusting a timing of the enabling switch T1 based on the output of the amplifier 950, and means 1306 for enabling the switch T1 when the output of the switch T1 falls below a first threshold above a zero crossover point.

In an embodiment, means 1302 for monitoring an output of an enabling switch T1 of the amplifier 950 can be configured to perform one or more of the functions discussed above with respect to the block 1202 illustrated in FIG. 12. The means 1302 for monitoring an output of an enabling switch T1 of the amplifier 950 may correspond to, for example, one or more of the first and second op-amps 960 and 970 (FIG. 9), the phase detection loop 1010 (FIG. 10), the drain power detector 1130 (FIG. 11), the antenna current detector 1140, and the microcontroller 1150.

In an embodiment, means 1304 for adjusting a timing of the enabling switch T1 based on the output of the amplifier 950 can be configured to perform one or more of the functions discussed above with respect to the block 1204 illustrated in FIG. 12. The means 1304 for adjusting a timing of the enabling switch T1 based on the output of the amplifier 950 may correspond to, for example, one or more of the first flip-flop 920 (FIG. 9), the phase detection loop 1010 (FIG. 10), and the microcontroller 1150 (FIG. 11).

In an embodiment, means 1306 for enabling the switch T1 when the output of the switch T1 falls below a first threshold above a zero crossover point can be configured to perform one or more of the functions discussed above with respect to the block 1206 illustrated in FIG. 12. The means 1306 for enabling the switch T1 when the output of the switch T1 falls below a first threshold above a zero crossover point may correspond to, for example, one or more of the first flip-flop 920 (FIG. 9), the phase detection loop 1010 (FIG. 10), and the microcontroller 1150 (FIG. 11).

Figure 14:
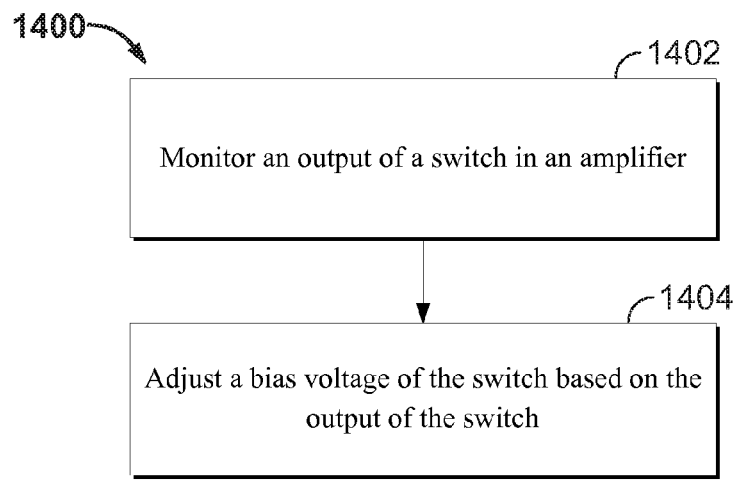
FIG. 14 shows a flow chart of another exemplary method of controlling operation of an amplifier.

FIG. 14 shows a flow chart 1400 of an exemplary method of controlling operation of an amplifier. The method can be implemented on one or more of the devices described above with respect to FIGS. 1-11. Although the method is described below with respect to elements of the circuit 900 (FIG. 9), those having ordinary skill in the art will appreciate that other components may be used to implement one or more of the steps described herein. Although blocks may be described as occurring in a certain order, the blocks can be reordered, blocks can be omitted, and/or additional blocks can be added.

First, at block 1402, the circuit 900 monitors an output of the switch T1 of the class-E amplifier 950. In another embodiment, the phase detection loop 1010 (FIG. 10) can monitor the output of the switch T1. In yet another embodiment, the microcontroller 1150 (FIG. 11) can monitor the output of the switch T1.

Next, at block 1403, the circuit 900 adjusts a bias voltage of the switch T1 based on the output of the switch T1. In an embodiment, the amplifier may include a resonant gate drive system (not shown) in which the switch T1 timing may not be easily adjusted directly. In an embodiment, the DC offset of the amplifier 950 can be adjusted so as to adjust the output waveform to be near zero when the switch is closed. In an embodiment, the circuit 900 can adjust the DC offset of the amplifier 950. In another embodiment, the microcontroller 1150 can adjust the adjust the DC offset of the amplifier 950.

Figure 15:
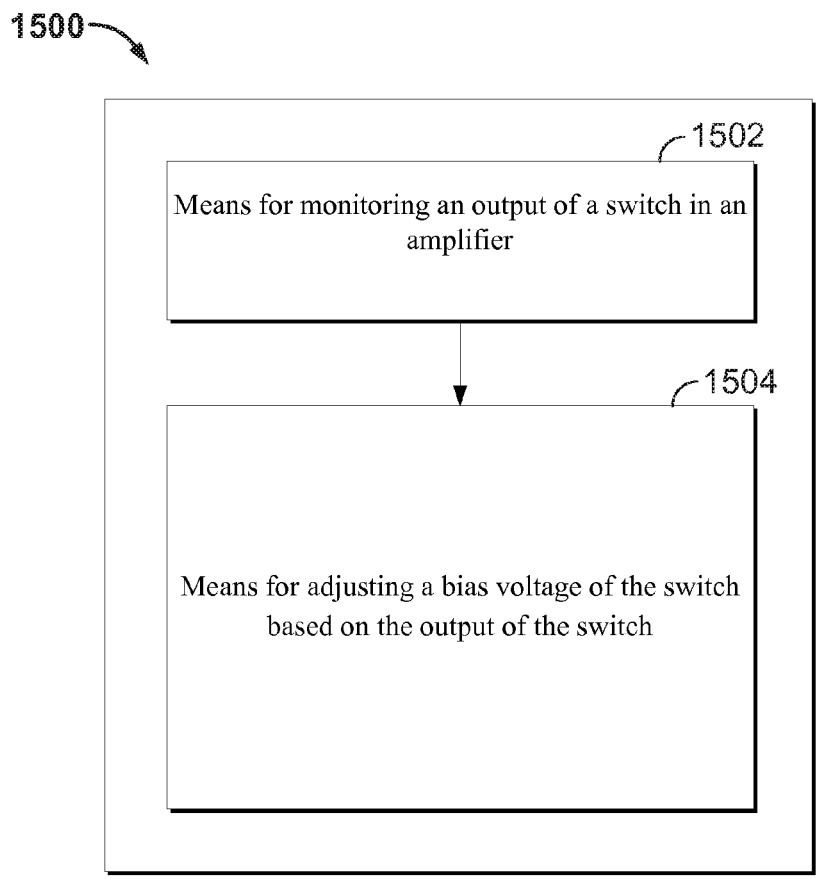
FIG. 15 is a functional block diagram of another exemplary wireless device that may be employed within the wireless power transfer system of FIG. 1.

FIG. 15 is a functional block diagram 1500 of an exemplary wireless device that may be employed within the wireless power transfer system of FIG. 1. The device 1500 comprises means 1502 for monitoring an output of the switch T1 in the amplifier 950, and means 1504 for adjusting a bias voltage of the switch T1 based on the output of the switch T1.

In an embodiment, means 1502 for monitoring an output of the switch T1 in the amplifier 950 can be configured to perform one or more of the functions discussed above with respect to the block 1402 illustrated in FIG. 14. The means 1502 for monitoring an output of the switch T1 in the amplifier 950 may correspond to, for example, one or more of the first and second op-amps 960 and 970 (FIG. 9), the phase detection loop 1010 (FIG. 10), the drain power detector 1130 (FIG. 11), the antenna current detector 1140, and the microcontroller 1150.

In an embodiment, means 1504 for adjusting a bias voltage of the switch T1 based on the output of the switch T1 can be configured to perform one or more of the functions discussed above with respect to the block 1404 illustrated in FIG. 14. The means 1504 for adjusting a bias voltage of the switch T1 based on the output of the switch T1 may correspond to, for example, one or more of the driver 224 (FIG. 2) and the amplifier 424 (FIG. 4).

It should be appreciated while the systems described above may employ a class E amplifier, the systems and method described herein are not limited to the use of a class E amplifier and may make use of other classes and/or types of amplifiers according to various embodiments.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A wireless power transfer apparatus, comprising:
    an amplifier circuit operably coupled to a coil configured to wirelessly transfer power to a receiver, the amplifier circuit comprising a switching element; and
    a monitoring circuit configured to:
        cause the switching element to be in an open position during a first phase,
        cause the switching element to be in a closed position during a second phase in response to determining that a value indicative of a voltage across the switching element falls below a threshold value, and
        cause the switching element to be in a closed position during a third phase.

2. The apparatus of claim 1, wherein the monitoring circuit is further configured to cause the switching element to be in an open position if the voltage across the switching element is greater than the threshold value during a startup phase and until the amplifier circuit is in a stable condition.

3. The apparatus of claim 1, wherein:
    the amplifier circuit is configured to not conduct current across the switching element during the first phase, and
    the monitoring circuit is further configured to:
        adaptively conduct current across the switching element based on the voltage across the switching element during the second phase, and
        conduct current across the switching element during the third phase.

4. The apparatus of claim 1, wherein the monitoring circuit is configured to cause the switching element to be in a closed position during the third phase in response to determining that the switching element was not closed during the second phase.

5. The apparatus of claim 1, wherein the switching element comprises a gate terminal, and wherein the monitoring circuit is further configured to conduct current across the switching element by driving the gate terminal with a first gate voltage.

6. The apparatus of claim 5, wherein the monitoring circuit is further configured to:
    drive the gate terminal with a second gate voltage during the first phase,
    adaptively drive the gate terminal with the first gate voltage based on the voltage across the switching element during the second phase, and
    drive the gate terminal with the second voltage above the gate voltage threshold during the third phase.

7. The apparatus of claim 6, wherein the amplifier circuit further comprises a class E amplifier and the switching element comprises a field effect transistor comprising the gate terminal.

8. The apparatus of claim 1, wherein the threshold value is greater than zero.

9. The apparatus of claim 1, wherein the threshold value is set to a level to cause the switching element to be in a closed position before the voltage across the switching element becomes negative.

10. The apparatus of claim 1, wherein the first phase comprises a first time period, wherein the second phase comprises a second time period after the first time period, and wherein the third phase comprises a third time period after the first time period and the second time period.

11. A method of wireless charging, comprising:
    opening a switching element of an amplifier circuit coupled to a coil during a first phase, the coil configured to wirelessly transfer power to a receiver;
    closing the switching element during a second phase in response to determining that a voltage across the switching element falls below a threshold value; and
    closing the switching element during a third phase.

12. The method of claim 11, wherein the opening a switching element comprises not conducting current across the switching element, and the closing the switching element comprises conducting current across the switching element.

13. The method of claim 11, wherein the opening or closing the switching element comprises a field effect transistor having a gate terminal configured to be driven by an input waveform to be in an open position or a closed position.

14. A wireless power transfer apparatus, comprising:
    a coil configured to wirelessly transfer power via a wireless field;
    a driver circuit operably coupled to the coil, the driver circuit configured to receive an input waveform signal, the driver circuit comprising a class E amplifier circuit comprising a switching element controlled by the input waveform signal; and
    a controller configured to adjust a timing of the input waveform signal based on monitoring characteristics of the driver circuit, the characteristics indicative of reactive variations of a load presented to the driver circuit caused by variations in coupling via the wireless field, the input waveform signal is configured to:
- adjust a state of the switching element to cause current to not be conducted through the switching element during a first phase; and
- adjust the state of the switching element to cause current to be conducted through the switching element during a second phase after the first phase, and wherein the controller is configured to:
  - adjust the timing of the input waveform to cause current to be conducted through the switching element during a third phase between the first and second phase in response to determining that a value indicative of a voltage across the switching element falls below a threshold value.

15. The apparatus of claim 14, wherein the controller is further configured to monitor the characteristics based on variations in coupling due to a variable number of receivers configured to couple to the wireless field.

16. The apparatus of claim 14, wherein the timing of the input waveform signal is configured to match an output waveform signal of the driver circuit, the output waveform signal indicative of reactive variations of the load presented to the driver circuit.

17. The apparatus of claim 14, wherein a pulse width of the output waveform signal is configured to match a duty cycle of the driver circuit.

18. The apparatus of claim 14, wherein the threshold is determined to cause current to be conducted through the switching element before the voltage across the switching element becomes negative.

* * * * *